(12) United States Patent
Chung et al.

(10) Patent No.: US 12,249,367 B2
(45) Date of Patent: Mar. 11, 2025

(54) WRITE ASSIST CIRCUIT FOR MEMORY DEVICE

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Chia-Che Chung, Hsinchu (TW); Hsin-Cheng Lin, Taipei (TW); Chee-Wee Liu, Taipei (TW)

(73) Assignees: TAIWAN SEMICONDUCTOR MANUFACTURING COMPANY, LTD., Hsinchu (TW); NATIONAL TAIWAN UNIVERSITY, Taipei (TW)

(*) Notice: Subject to any disclaimer, the term of this patent is extended or adjusted under 35 U.S.C. 154(b) by 405 days.

(21) Appl. No.: 17/720,154

(22) Filed: Apr. 13, 2022

(65) Prior Publication Data

US 2023/0335186 A1    Oct. 19, 2023

(51) Int. Cl.
*G11C 11/00* (2006.01)
*G11C 11/419* (2006.01)

(52) U.S. Cl.
CPC .................... *G11C 11/419* (2013.01)

(58) Field of Classification Search
CPC .................................................. G11C 11/419
USPC ........................................................ 365/154
See application file for complete search history.

(56) References Cited

U.S. PATENT DOCUMENTS

| 7,092,280 B2 | 8/2006 | Joshi |
| 9,336,865 B1 | 5/2016 | Chu et al. |
| 2002/0047166 A1 | 4/2002 | Takahashi |
| 2015/0036417 A1 | 2/2015 | Jung et al. |
| 2015/0255148 A1* | 9/2015 | Roy ..................... G11C 11/4096 365/154 |
| 2019/0189197 A1* | 6/2019 | Nii ........................ G11C 11/412 |
| 2022/0139450 A1* | 5/2022 | Fujiwara ............... G11C 11/419 365/154 |

FOREIGN PATENT DOCUMENTS

| CN | 1790547 A | 6/2006 |
| TW | 201703040 A | 1/2017 |

OTHER PUBLICATIONS

Taejoong Song et al., "A 7nm FinFET SRAM Using EUV Lithography with Dual Write-Driver-Assist Circuitry for Low-Voltage Applications", 2018 IEEE International Solid-State Circuits Conference (ISSCC), 2018.

(Continued)

*Primary Examiner* — Hoai V Ho
(74) *Attorney, Agent, or Firm* — Maschoff Brennan

(57) ABSTRACT

A device is provided. The device includes a memory cell and a first write assist circuit. The memory cell operates with a first supply voltage and a second supply voltage different from the first supply voltage. The first write assist circuit includes a first write assist switch and a second write assist switch that are coupled to the memory cell through a first data line. In a write operation of a data, having a first logic value, to the memory cell, the first write assist switch transmits the first supply voltage to the first data line in response to a first control signal, received at a control terminal of the first write assist switch and having a voltage level of the second supply voltage, when the second write assist switch is configured to be turned off.

20 Claims, 6 Drawing Sheets

(56) References Cited

OTHER PUBLICATIONS

Taejoong Song et al., "A 3nm Gate-All-Around SRAM Featuring an Adaptive Dual-BL and an Adaptive Cell-Power Assist Circuit", 2021 IEEE International Solid-State Circuits Conference (ISSCC), 2021.

* cited by examiner

WRITE ASSIST CIRCUIT FOR MEMORY DEVICE

BACKGROUND

Memory is an important component in electric devices, and reducing the power consumption in write operation or/and read operation has become pivotal topic in designing memory devices especially in mobile electric devices. Some approaches for tackling such challenges suffer from large area penalty or extra driving power design.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
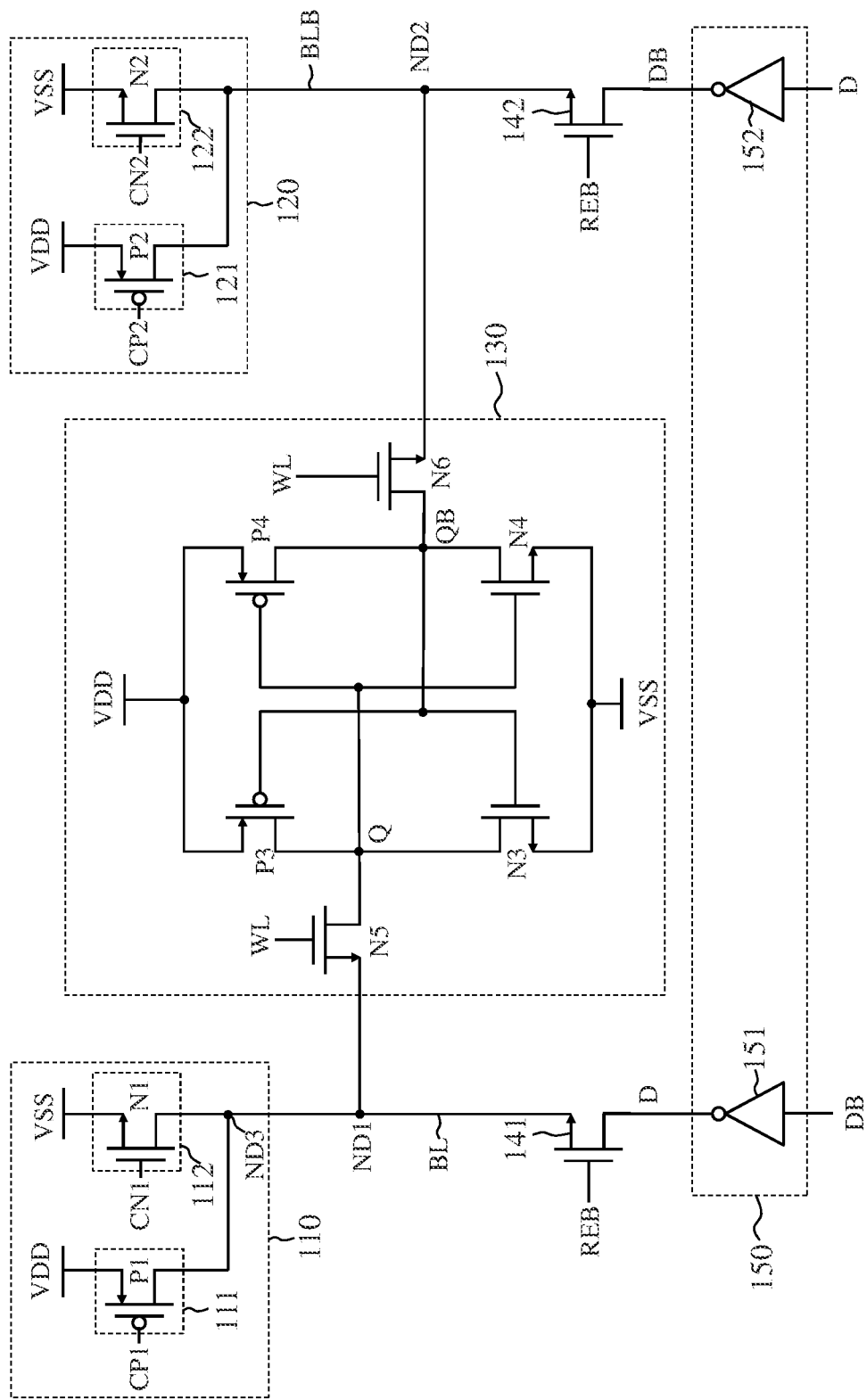
FIG. 1 is a schematic diagram of a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a schematic diagram of a memory device 100, in accordance with some embodiments. As shown in FIG. 1, the memory device 100 includes write assist circuits 110, 120, a memory cell 130, write switches 141,142, and a write driver circuit 150. For illustration, the memory cell 130 is coupled between a node ND1 on at a data line BL and a node ND2 on a data line BLB, in which the data lines BL and BLB are a pair of complementary data lines, and referred to the bit lines in some embodiments. The node ND1 is between the write assist circuit 110 and the write switch 141 that is further coupled to a write driver 151 of the write driver circuit 150. Similarly, the node ND2 is between the write assist circuit 120 and the write switch 142 that is further coupled to a write driver 152 of the write driver circuit 150. Alternatively stated, the write switches 141-142 are coupled between the write assist circuits 110-120 and the write driver circuit 150 respectively.

As illustratively shown in FIG. 1, the write assist circuit 110 includes write assist switches 111 and 112. For illustration, the write assist switch 111 has a first terminal coupled to a voltage terminal (referred to as the voltage terminal VDD herein) providing a supply voltage VDD and a second terminal coupled to the data line BL. The write assist switch 112 has a first terminal coupled to a voltage terminal (referred to as the voltage terminal VSS herein) providing a supply voltage VSS and a second terminal coupled to the data line BL. In some embodiments, the write assist switch 111 includes a P-type transistor P1 having a source terminal configured as the first terminal of the write assist switch 111, a drain terminal configured as the second terminal of the write assist switch 111, and a control terminal configured to receive a control signal CP1. The write assist switch 112 includes a N-type transistor N1 having a source terminal configured as the first terminal of the write assist switch 112, a drain terminal configured as the second terminal of the write assist switch 112, and a control terminal configured to receive a control signal CN1.

Similarly, the write assist circuit 120 includes write assist switches 121 and 122. For illustration, the write assist switch 121 has a first terminal coupled to the voltage terminal VDD and a second terminal coupled to the data line BLB. The write assist switch 122 has a first terminal coupled to the voltage terminal VSS and a second terminal coupled to the data line BLB. In some embodiments, the write assist switch 121 includes a P-type transistor P2 having a source terminal configured as the first terminal of the write assist switch 121, a drain terminal configured as the second terminal of the write assist switch 121, and a control terminal configured to receive a control signal CP2. The write assist switch 122 includes a N-type transistor N2 having a source terminal configured as the first terminal of the write assist switch 122, a drain terminal configured as the second terminal of the write assist switch 122, and a control terminal configured to receive a control signal CN2.

In some embodiments, the memory cell 130 is configured to operate with the supply voltages VDD and VSS. In some embodiments, the supply voltages VDD and VSS are different from each other. In various embodiments, the supply voltage VSS has a grounded voltage level. The memory cell 130 includes a static random access memory (SRAM) cell having transistors P3-P4 and N3-N6. The transistors P3 and N3 are configured as an inverter cross-coupled with another inverter configured by the transistors P4 and N4. Specifically, source terminals of the transistors P3-P4 are coupled to the voltage terminal VDD, and source terminals of the transistors N3-N4 are coupled to the voltage terminal VSS. Gate terminals of the transistors P3 and N3 are coupled to drain terminals of the transistors P4 and N4 and a drain terminal of the transistor N6 at a node QB. Gate terminals of the transistors P4 and N4 are coupled to drain terminals of the transistors P3 and N3 and a drain terminal of the transistor N5 at a node Q. Source terminals of the transistors N5-N6 are coupled to the nodes ND1 and ND2 respectively, and gate terminals of the transistors N5-N6 are coupled to a word line WL to receive a word line signal in order to switch the transistors N5-N6.

For illustration, the write driver circuit 150 includes write drivers 151 and 152. In some embodiments, the write drivers 151-152 are implemented with inverters. For example, by inverting an inverted data DB to generate the data D, the write driver 151 transmits the data D to the data line BL. Similarly, by inverting the data D to generate the inverted data DB, the write driver 152 transmits the inverted data DB to the data line BLB.

The configurations of FIG. 1 are given for illustrative purposes. Various implements are within the contemplated scope of the present disclosure. For example, in some embodiments, the memory cell 130 includes other type of memory cell rather than a SRAM cell.

Figure 2:
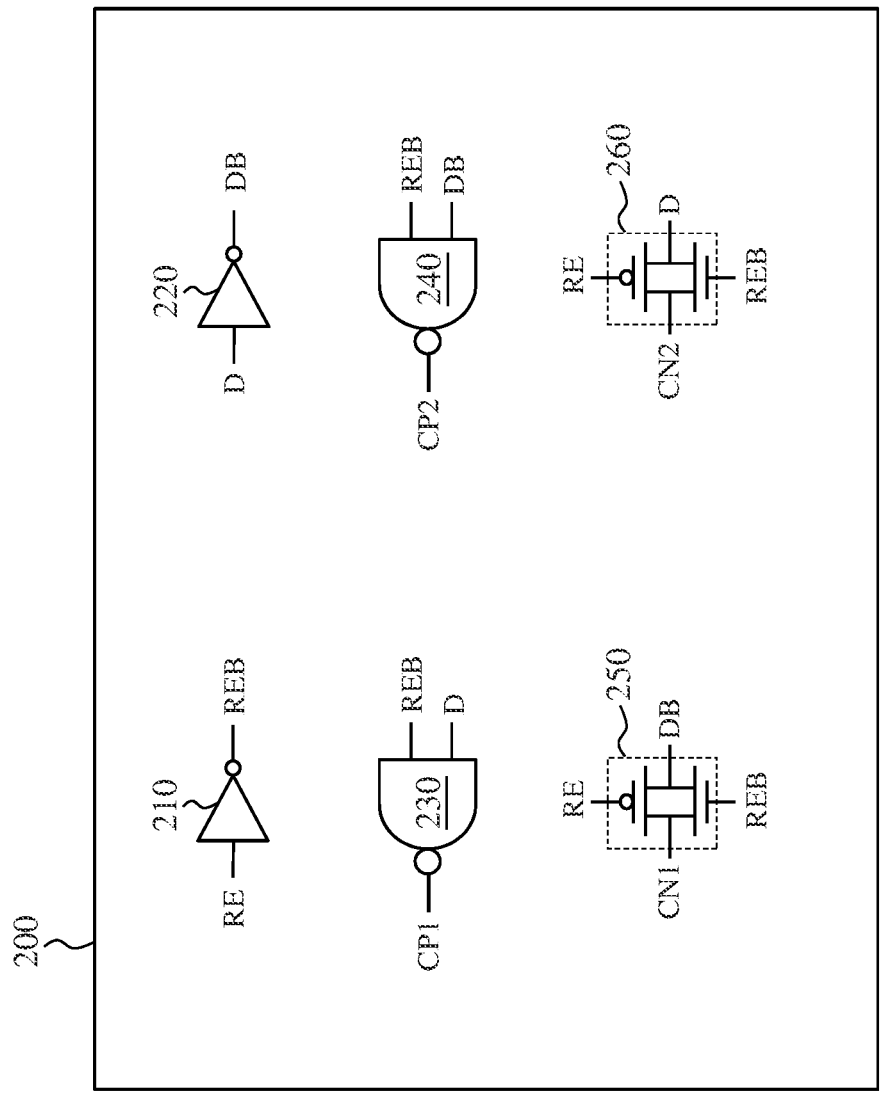
FIG. 2 is a schematic diagram of a control circuit, in accordance with some embodiments.

Reference is now made to FIG. 2. FIG. 2 is a schematic diagram of a control circuit 200, in accordance with some embodiments. In some embodiments, the control circuit 200 is configured to generate the control signals CP1-CP2 and CN1-CN2 in FIG. 1 according to a read enable signal RE and a logic value of a data D being written into the memory cell 130. Specifically, as shown in FIG. 2, the control circuit 200 includes logic circuits such as inverters 210, 220, NAND gates 230-240, and transmission gates 250-260. In some embodiments, the inverters 210, 220, the NAND gates 230-240, and the transmission gates 250-260 included in the control circuit 200 operates in the same voltage domain as the memory device 100.

In some embodiments, the inverter 210 is configured to generate an inverted read enable signal REB by inverting the read enable signal RE. The inverter 220 is configured to generate the inverted data DB based on the data D.

The NAND gate 230 is configured to generate the control signal CP1 according to the inverted read enable signal REB and the data D. Accordingly, the control signal CP1 has a logic value ($\overline{REB \cap D}$). The NAND gate 240 is configured to generate the control signal CP2 according to the inverted read enable signal REB and the data DB. Accordingly, the control signal CP2 has a logic value ($\overline{REB \cap DB}$).

The transmission gate 250 is configured to generate the control signal CN1 according to the read enable signals RE, REB and the inverted data DB. Accordingly, the control signal CN1 has a logic value (REB ∩ DB). The transmission gate 260 is configured to generate the control signal CN2 according to the read enable signals RE, REB and the data D. Accordingly, the control signal CN2 has a logic value (REB ∩ D).

In some embodiments, the read enable signal RE is associated with the operation of the memory cell 130. For example, the read enable signal RE has the low logic value in a write operation of the memory cell 130, and has the high logic value in a read operation of the memory cell 130. Accordingly, the logic values of the control signals CP1, CP2, CN1, CN2, the read enable signals REB, RE, the data D and the inverted data DB are summarized in table I as below:

TABLE I logic values of the control signals CP1, CP2, CN1, CN2, the read enable signals RE, the inverted read enable signal REB, the data D and the inverted data DB in read and write operation

| OPERATION | RE | REB | D | DB | CP1 | CN1 | CP2 | CN2 |
|---|---|---|---|---|---|---|---|---|
| READ | 1 | 0 | 0/1 | 1/0 | 1 | floating | 1 | floating |
| WRITE | 0 | 1 | 1 | 0 | 0 | 0 | 1 | 1 |
| | 0 | 1 | 0 | 1 | 1 | 1 | 0 | 0 |

Table I: logic values of the control signals CP1, CP2, CN1, CN2, the read enable signals RE, the inverted read enable signal REB, the data D and the inverted data DB in read and write operation Table I: logic values of the control signals CP1, CP2, CN1, CN2, the read enable signals RE, the inverted read enable signal REB, the data D and the inverted data DB in read and write operation The configurations of FIG. 2 are given for illustrative purposes. Various implements are within the contemplated scope of the present disclosure. For example, in some embodiments, the control circuit 200 includes other logic circuits that are able to generate the control signals CP1-CP2, and CN1-CN2 according to the read enable signal RE and the data D.

With reference to FIGS. 1 and 2 together, in some embodiments, during a read operation of the memory cell 130, the read enable signal RE is configured to have a high logic value (e.g., "1"), and accordingly, the inverted read enable signal REB has a low logic value (e.g., "0".) Correspondingly, the control signals CP1 and CP2 have the high logic value to turn off the transistors P1 and P2, and the control signals CN1 and CN2 are referred to as floating to turn off the transistors N1 and N2. In some embodiments, signals having high logic value, such like the control signals CP1,CP2, are referred to as having a voltage level of the supply voltage VDD. In addition, in response to the inverted read enable signal REB having the low logic value (referred to as a voltage level of the supply voltage VSS), the write switches 141-142 in FIG. 1 are turned off to disconnect the nodes ND1 and ND2 from the write driver circuit 150.

Figure 3:
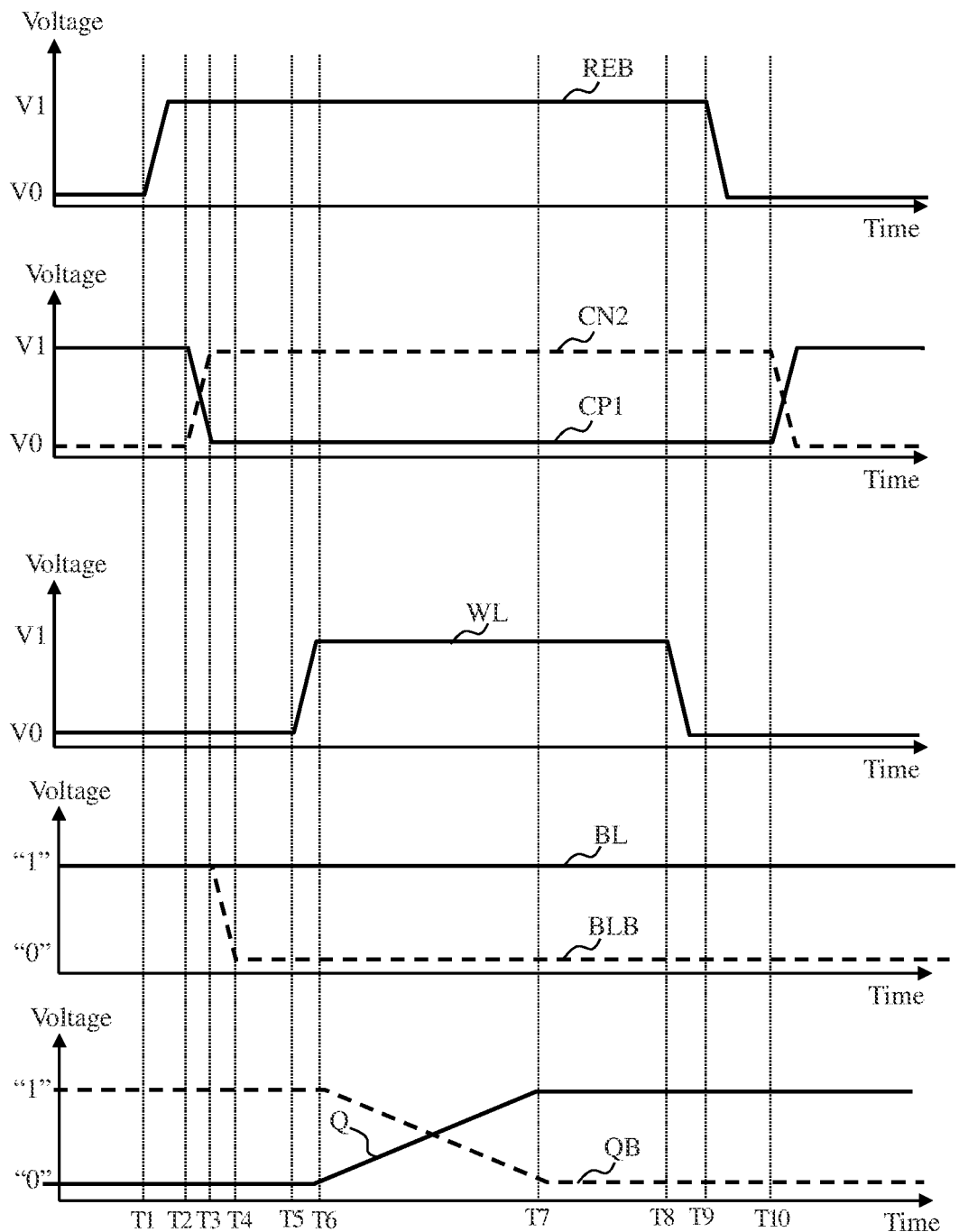
FIG. 3 is a schematic diagram of waveforms illustrating signals and voltages of the memory device in FIG. 1 during a write operation according to some embodiments of the present disclosure.

Reference is further made to FIG. 3. FIG. 3 is a schematic diagram of waveforms illustrating signals and voltages of the memory device 100 in FIG. 1 during a write operation according to some embodiments of the present disclosure.

With reference to FIGS. 1-3 and table I together, in a write operation of the data D having a high logic value ("1") to the memory cell 130, the write driver circuit 150 is configured to transmit the data D to the memory cell 130 through the write driver 151 and the data line BL and to transmit the inverted data DB through the write driver 152 and the data line BLB while the write switches 141-142 are turned on in response to the inverted read enable signal REB having the high logic value.

Furthermore, for the write assist circuit 110, the write assist switch 111 is configured to transmit the supply voltage VDD to the data line BL in response to the control signal CP1, having the low logic value and the voltage level of the supply voltage VSS, when the write assist switch 112 is configured to be turned off in response to the control signal CN1 having low logic value and the voltage level of the supply voltage VSS. In addition, for the write assist circuit 120, the write assist switch 121 is configured to be turned off in response to the control signal CP2 having high logic value and the voltage level of the supply voltage VDD, while the write assist switch 122 is configured to transmit the supply voltage VSS to the data line BLB in response to the control signal CN2, having the high logic value and the voltage level of the supply voltage VDD.

Specifically, with reference to FIG. 3, at the time T1, the operation of the memory cell 130 is switched to the write operation, and the voltage level of the inverted read enable signal REB begins rising from a voltage V0 (e.g., the supply voltage VSS) to a voltage V1 (e.g., the supply voltage VDD.)

At the time T2, in response to the increased the inverted read enable signal REB, the control signal CP1 changes from the voltage V1 to the voltage V0 while the control signal CN2 changes from the voltage V0 to the voltage V1. According, as shown in FIG. 1, in response to the control signals CP1 and CN2, the transistor P1 in the write assist switch 111 and the transistor N2 in the write assist switch 122 are gradually turned on.

At the time T3, the write assist switch 111 is turned on to charge the data line BL to have a voltage level corresponding to the high logic value "1" by transmitting the supply voltage VDD, and the write assist switch 122 is turned on to discharge the data line BLB to have a voltage level corresponding to the low logic value "0" by transmitting the supply voltage VSS. Accordingly, the voltage level of the data line BLB decreases.

After the time T4, the voltage levels of the data lines BL and BLB are stable. At the time T5, a voltage level of the word line WL increases from the voltage V0 to the voltage V1 for turning on the transistors N5-N6 for coupling the memory cell 130 to the data lines BL and BLB.

During the times T6-T7, in response to turned on transistors N5-N6, a voltage level of the node Q starts being charged by the data line BL and increases while a voltage level of the node QB starts being discharged by the data line BLB and decreases.

At the time T7, the node Q has a voltage level corresponding to the high logic value "1" and the node QB has a voltage level corresponding to the low logic value "0". Accordingly, as the logic value of the node Q represents data stored in the memory cell 130, the data D is written into the memory cell 130.

At the time T8, the voltage level of the word line WL drops from the voltage V1 to the voltage V0 for turning off the transistors N5-N6 for disconnecting the memory cell 130 from the data lines BL and BLB.

At the time T9, the voltage level of the inverted read enable signal REB drops from the voltage V1 to the voltage V0 to turn off the write switches 141-142 and to change the control signals CP1 and CN2.

At the time T10, in response to the decreased inverted read enable signal REB, the control signal CP1 changes from the voltage V0 to the voltage V1 while the control signal CN2 changes from the voltage V1 to the voltage V0. Accordingly, in response to the control signals CP1 and CN2, the transistor P1 in the write assist switch 111 and the transistor N2 in the write assist switch 122 are gradually turned off.

Figure 4:
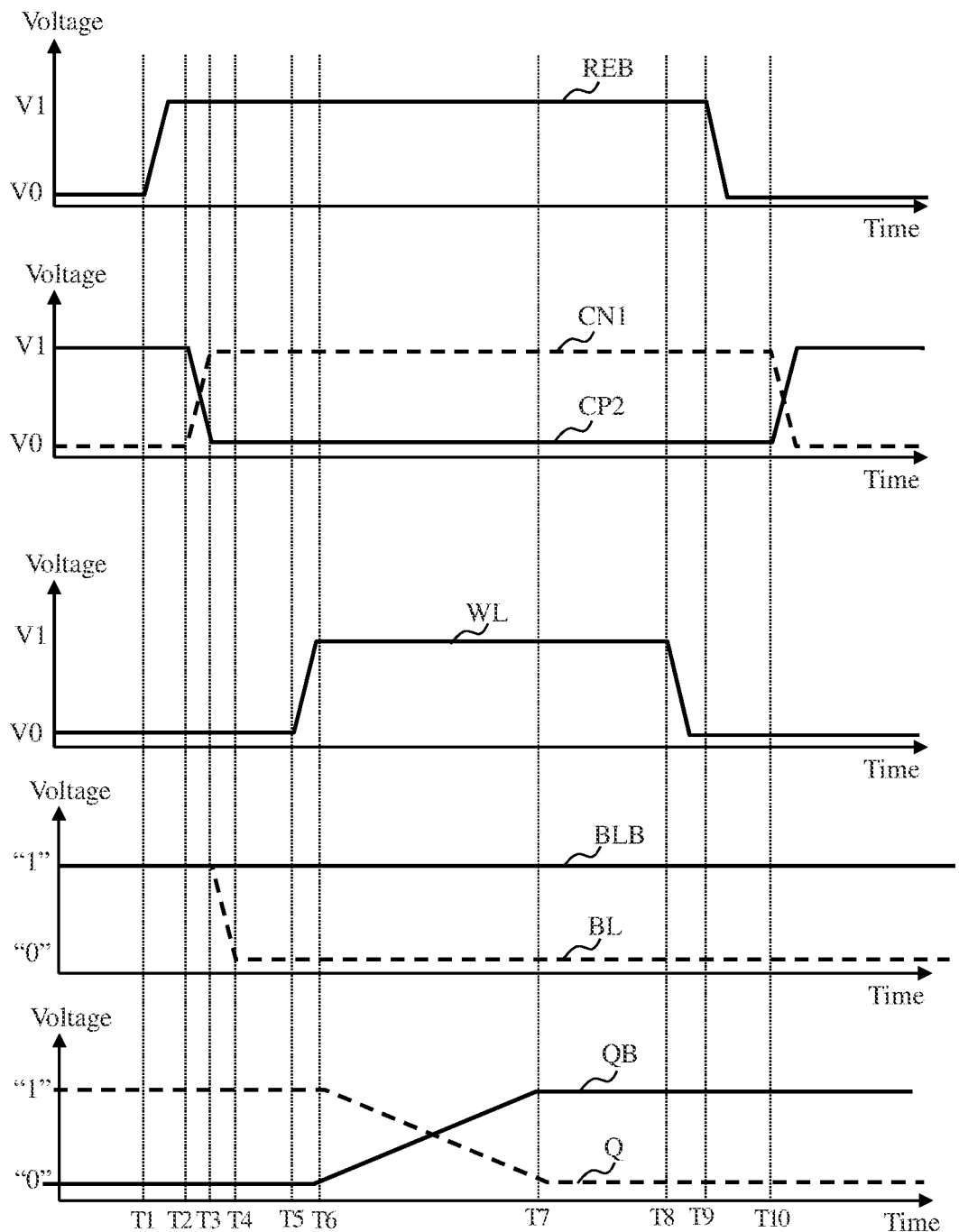
FIG. 4 is a schematic diagram of waveforms illustrating signals and voltages of the memory device in FIG. 1 during a write operation according to some embodiments of the present disclosure.

Reference is further made to FIG. 4. FIG. 4 is a schematic diagram of waveforms illustrating signals and voltages of the memory device 100 in FIG. 1 during the write operation according to some embodiments of the present disclosure.

Compared with FIG. 3, during a write operation of the data D having the low logic value ("0") to the memory cell 130 as shown in FIG. 4, in response to the inverted read enable signal REB, at time T2, the control signal CP2 changes from the voltage V1 to the voltage V0 while the control signal CN1 changes from the voltage V0 to the voltage V1. According, as shown in FIG. 1, in response to the control signals CP2 and CN1, the transistor P2 in the write assist switch 121 and the transistor N1 in the write assist switch 112 are gradually turned on.

At the time T3, the write assist switch 121 is turned on to charge the data line BLB to have the voltage level corresponding to the high logic value "1" by transmitting the supply voltage VDD, and the write assist switch 112 is turned on to discharge the data line BL to have the voltage level corresponding to the low logic value "0" by transmitting the supply voltage VSS. Accordingly, the voltage level of the data line BL decreases.

After the time T4, the voltage levels of the data lines BL and BLB are stable. At the time T5, the voltage level of the word line WL increases from the voltage V0 to the voltage V1 for turning on the transistors N5-N6 for coupling the memory cell 130 to the data lines BL and BLB.

During the times T6-T7, in response to turned on transistors N5-N6, the voltage level of the node QB starts being charged by the data line BLB and increases while a voltage level of the node Q starts being discharged by the data line BL and decreases.

At the time T7, the node QB has the voltage level corresponding to the high logic value "1" and the node Q has the voltage level corresponding to the low logic value "0".

Accordingly, as the logic value of the node QB represents data stored in the memory cell 130, the data D, having the low logic value, is written into the memory cell 130.

At the time T8, the voltage level of the word line WL drops from the voltage V1 to the voltage V0 for turning off the transistors N5-N6 for disconnecting the memory cell 130 from the data lines BL and BLB.

At the time T9, the voltage level of the inverted read enable signal REB drops from the voltage V1 to the voltage V0 to turn off the write switches 141-142 and to change the control signals CP2 and CN1.

At the time T10, in response to the decreased inverted read enable signal REB, the control signal CP2 changes from the voltage V0 to the voltage V1 while the control signal CN1 changes from the voltage V1 to the voltage V0. Accordingly, in response to the control signals CP2 and CN1, the transistor P2 in the write assist switch 121 and the transistor N1 in the write assist switch 112 are gradually turned off.

In some approaches, dual write driver circuits are utilized to reduce effective bit line resistance in the write operation of the memory cell, and result in undesired large design overhead. Yet in some other approaches, the scheme including adaptive dual bit line for cutting effective bit line resistance requires at least two N-type FET switches in which gate biases higher than the supply (operating) voltage VDD are applied on gate terminals thereof. Alternatively stated, it needs complex power supply arrangements and further induces extra power consumption.

With the configurations of the present disclosure, by utilizing two pairs of one P-type transistor and one N-type transistor to charge and discharge two complementary data lines (bit lines), the effective resistance eRBL of each of the data lines BL and BLB in the view of the memory cell is expressed as the equation (1) as below:

$$eRBL = \frac{(\alpha RBL) \times (1 - \alpha)RBL}{(\alpha RBL) + (1 - \alpha)RBL} \quad (1)$$

in which RBL represents the resistance of the data line, for example, BL; α represents the proportion of a first length of the data line BL from a node ND3 to the node ND1 shown in FIGS. 1; and (1−α) represents the proportion of a second length of the data line BL from the node ND1 to the write switch, for example, 141. Accordingly, the effective resistance eRBL in the view of the memory cell 130 in the write operation is reduced and smaller than the resistance RBL. Correspondingly, the write speed and power consumption of the present disclosure are enhanced, compared with some approaches.

Figure 5:
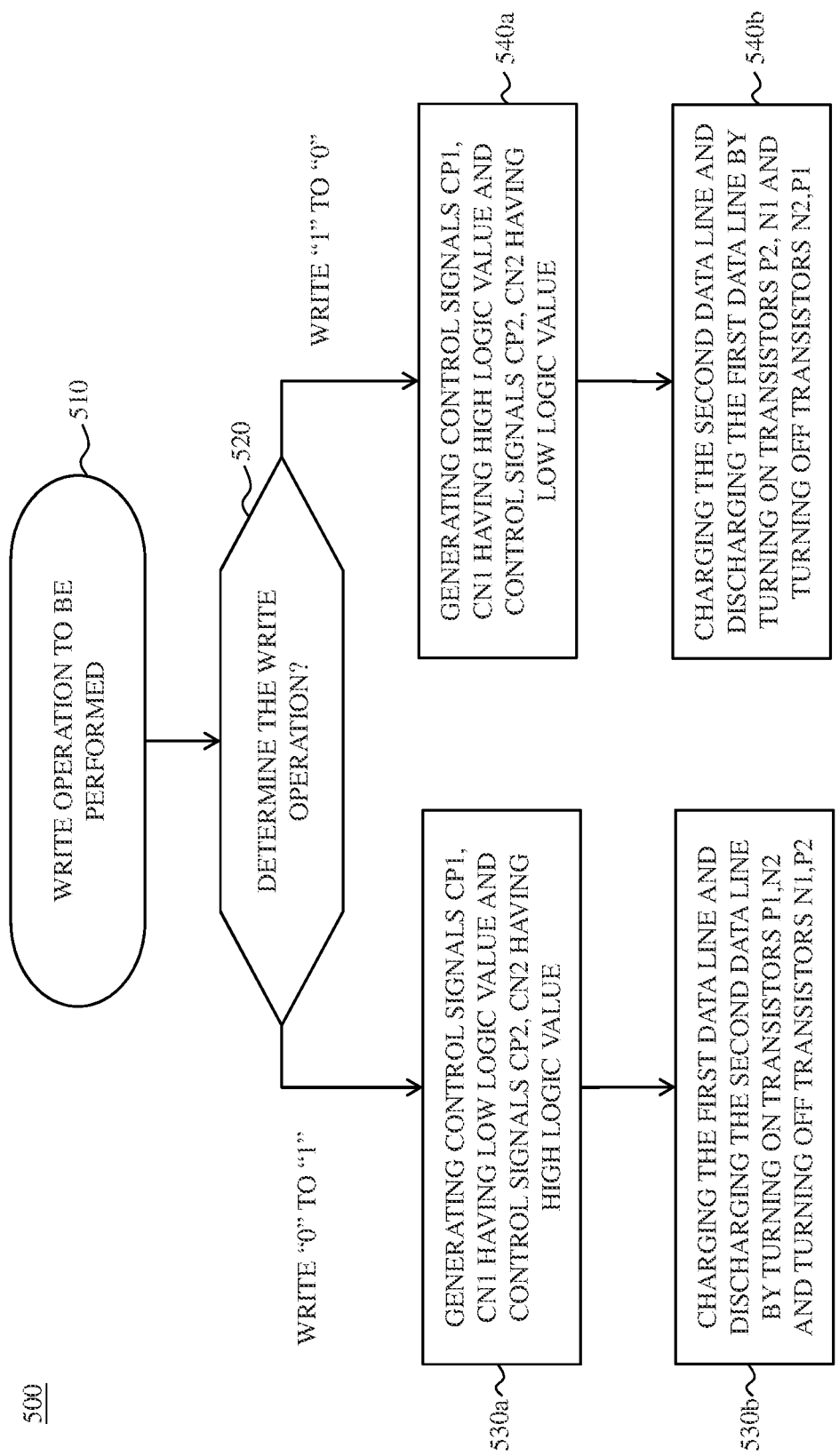
FIG. 5 is a flow chart illustrating a control method according to embodiments of the disclosure.

Reference is now made to FIG. 5. FIG. 5 is a flow chart illustrating a control method 500 according to embodiments of the disclosure. It is understood that additional operations can be provided before, during, and after the processes shown by FIG. 5, and some of the operations described below can be replaced or eliminated, for additional embodiments of the method. The order of the operations/processes may be interchangeable. Throughout the various views and illustrative embodiments, like reference numbers are used to designate like elements. The control method 500 includes operations 510-520, 530a-530b, and 540a-540b that are described below with reference to the memory device 100 in FIG. 1 and embodiments in FIGS. 2-4.

In operation 510, a write operation to the memory cell 130 in the memory device 100 is performed. In some embodiments, the read enable signal RE having the low logic value is generated.

In some embodiments, the control method 500 further includes operations of generating the inverted read enable signal REB according to the inverted read enable signal RE and transmitting the data D from the write driver circuit 150 to the data line BL by turning on the write switch 141 in response to the inverted read enable signal REB. The write switch 141 is coupled between the write driver circuit 150 and the node ND1. In some embodiments, the control method 500 further includes operations of transmitting the inverted data DB from the write driver circuit to the data line BLB by turning on the write switch 142 in response to the inverted read enable signal REB. The write switch 142 is coupled between the write driver circuit 150 and the node ND2.

In operation 520, the write operation is determined to write the data stored in the memory cell 130 from having the logic "0" to the logic "1" (e.g., to write the data D having the logic "1" to the memory cell 130) or from having the logic "1" to the logic "0" (e.g., to write the data D having the logic "0" to the memory cell 130). In response to the determination, the operations 530a-530b are performed if the data D having the logic "1" is determined to be written to the memory cell 130. On the contrary, the operations 540a-540b are performed if the data D having the logic "0" is determined to be written to the memory cell 130.

In some embodiments, the control method 500 further includes operations of generating the control signals CP1-CP2, CN1-CN2 according to the read enable signal RE and the logic value of the data D being written into the memory cell 130. As illustrated in FIG. 2, generating the control signals CP1-CP2, CN1-CN2 further includes generating, by the NAND gate 230, the control signal CP1 according to the inverted read enable signal REB and the data D; generating, by the transmission gate 250, the control signal CN1 according to the read enable signal RE, the inverted enable signal REB, and the inverted data DB; generating, by the transmission gate 260, the control signal CN2 according to the read enable signal RE, the inverted enable signal REB, and the data D; and generating, by the NAND gate 240, the control signal CP2 according to the inverted read enable signal REB and the inverted data DB.

With reference to FIG. 5, in operation 530a, in the embodiment of writing the data D having the high logic value to the memory cell 130, the control signals CP1, CN1 having the low logic value and the control signals CP2, CN2 having the high logic value are generated.

In operation 530b, by turning on the write assist switch 111, in response to the control signal CP1, and write assist switch 122, in response to the control signal CN2, and further turning off the write assist switch 112, in response the control signal CN1, and the write assist switch 121, in response to the control signal CP2, the data line BL is charged to have the voltage level of the supply voltage VDD (corresponding to the high logic value) and the data line BLB is discharged to have the voltage level of the supply voltage VSS (corresponding to the low logic value.) In some embodiments, the control method 500 further includes operations of turning off the write assist switches 112 and 121 when the write assist switches 111 and 122 are turned on.

In the embodiment of writing the data D having the low logic value to the memory cell 130, in operation 540a, the control signals CP1, CN1 having the high logic value and the control signals CP2, CN2 having the low logic value are generated.

In operation 540b, by turning on the write assist switch 121, in response to the control signal CP2, and write assist switch 112, in response to the control signal CN1, and further turning off the write assist switch 111, in response the control signal CP1, and the write assist switch 122, in response to the control signal CN2, the data line BL is discharged to have the voltage level of the supply voltage VSS (corresponding to the low logic value) and the data line BL is charged to have the voltage level of the supply voltage VDD (corresponding to the high logic value.)

Figure 6:
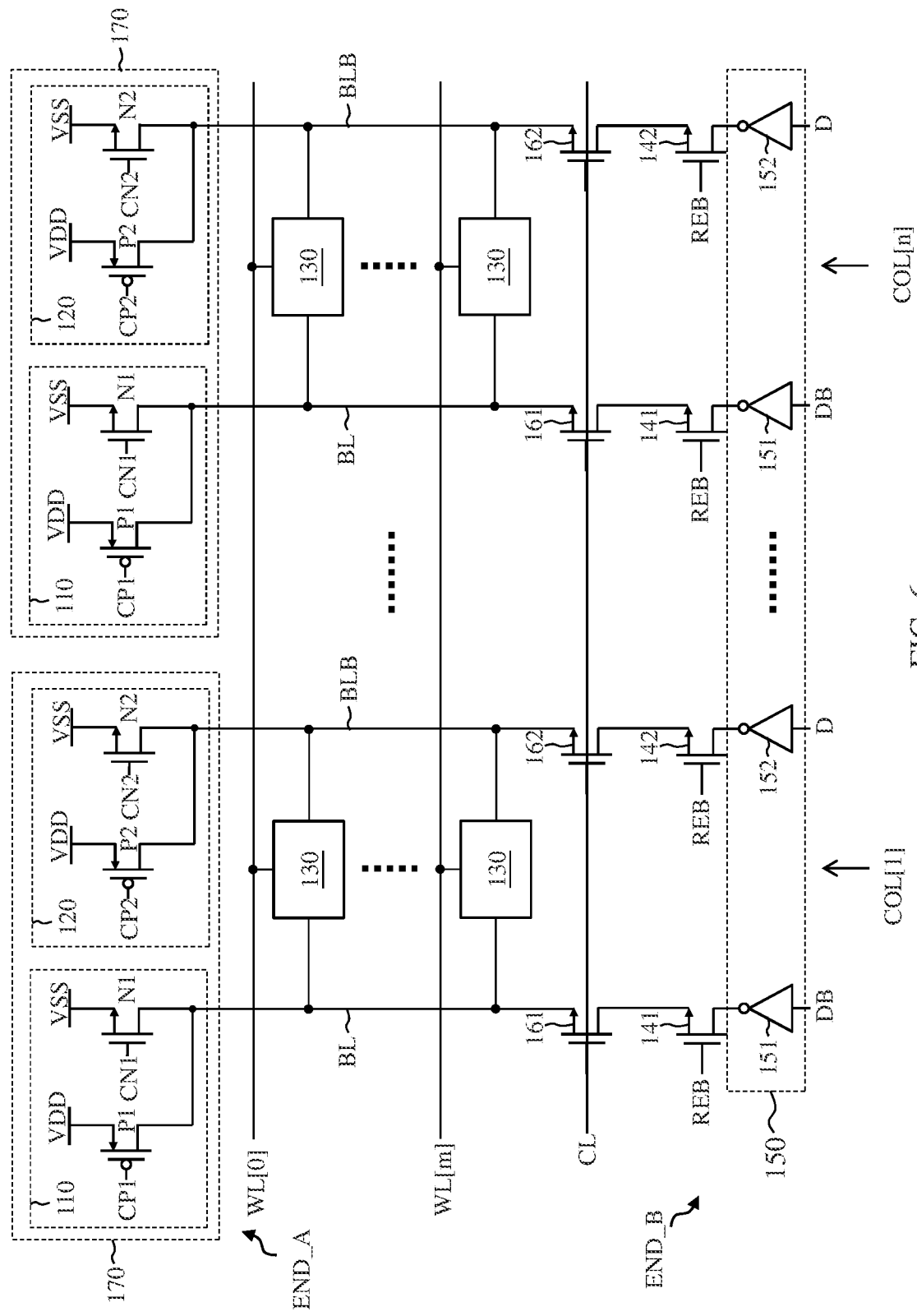
FIG. 6 is a schematic diagram of a memory device, in accordance with some embodiments.

Reference is now made to FIG. 6. FIG. 6 is a schematic diagram of the memory device 100 corresponding to FIG. 1, in accordance with various embodiments. With respect to the embodiments of FIGS. 1-5, like elements in FIG. 6 are designated with the same reference numbers for ease of understanding. The specific operations of similar elements, which are already discussed in detail in above paragraphs, are omitted herein for the sake of brevity.

As shown in FIG. 6, the memory device 100 further includes the memory cells 130 arranged in n memory columns COL[1]-COL[n] and multiple pairs 170 of the write assist circuits 110-120. For illustration, each pair 170 of the write assist circuits 110-120 is arranged in one memory column. Alternatively stated, one pair of pairs of the write assist circuits 110-120 are coupled to the data lines BL, BLB in a corresponding column in the memory columns COL[1]-COL[n].

Furthermore, in the embodiments of FIG. 6, the write driver circuit 150 is arranged on an end END_B of the (one of) memory columns COL[1]-COL[n], and the pairs 170 of the write assist circuits 110-120 are arranged on the other end END_A, opposite of the end END_B, of the (one of) memory columns COL[1]-COL[n].

In the write operation of the data D having the logic "1", for example, the transistor P1 as the selected one P-type transistor is turned on to transmit the supply voltage VDD to the memory cell 130 coupled thereto through the data line BL, and the transistor N2 as the selected one N-type transistor is turned on to transmit the supply voltage VSS to the memory cell 130 coupled thereto through the data line BLB.

Based on the above, the memory device of the present disclosure utilizes write assist circuits including one P-type transistor and one N-type transistor that are selectively turned on in the memory device to stabilize write operation and further cut the effective resistance of the pair of complementary data lines coupled thereto. Accordingly, due to reduced resistance, the write operation capacity of the memory device of the present disclosure is improved.

In some embodiments, a device is provided. The device includes a memory cell and a first write assist circuit. The memory cell operates with a first supply voltage and a second supply voltage different from the first supply voltage. The first write assist circuit includes a first write assist switch and a second write assist switch that are coupled to the memory cell through a first data line. In a write operation of a data, having a first logic value, to the memory cell, the first write assist switch transmits the first supply voltage to the first data line in response to a first control signal, received at a control terminal of the first write assist switch and having a voltage level of the second supply voltage, when the second write assist switch is configured to be turned off.

In some embodiments, the first write assist switch includes a first transistor of a first conductivity type and the second write assist switch includes a second transistor of a second conductivity type different from the first conductivity type.

In some embodiments, the first write assist switch has a first terminal coupled to the first data line and a second terminal coupled to a first voltage terminal providing the first supply voltage, and the second write assist switch has a first terminal coupled to the first data line and a second terminal coupled to a second voltage terminal providing the second supply voltage.

In some embodiments, in the write operation of the data, having a second logic value different from the first logic value, to the memory cell, the second write assist switch is configured to be turned on to transmit the second supply voltage to the first data line in response to a second control signal, received at a control terminal of the second write assist switch and having the voltage level of the first supply voltage, when the first write assist switch is configured to be turned off.

In some embodiments, the device further includes a control circuit configured to generate the first and second control signals according to a read enable signal and a logic value of the data. In a read operation of the memory cell, the read enable signal is configured to have a high logic value, the first control signal has the high logic value for turning off the first write assist switch, and the second control signal has a low logic value for turning off the second write assist switch.

In some embodiments, the device further includes a second write assist circuit including a third write assist switch and a fourth write assist switch that are coupled to the memory cell through a second data line which is a complementary data line for the first data line. In the write operation of the data, having the first logic value, to the memory cell, the third assist switch is configured to transmit the second supply voltage to the second data line in response to a second control signal, having a voltage level of the first supply voltage, when the fourth write assist switch is configured to be turned off In some embodiments, the device further includes a control circuit configured to generate the first and second control signals according to a read enable signal and a logic value of the data. In the write operation of the data having the first logic value to the memory cell, the read enable signal is configured to have a second logic value different from the first logic value, the first control signal has the second logic value, and the second control signal has the first logic value.

In some embodiments, in the write operation of the data, having the second logic value, to the memory cell, the fourth assist switch is configured to transmit the first supply voltage to the second data line in response to a third control signal, having the second logic value when the third write assist switch is configured to be turned off.

In some embodiments, the device further includes a write driver circuit configured to transmit the data to the memory cell through the first data line. The memory cell is coupled between the write driver circuit and the first write assist circuit.

In some embodiments, a control method of a memory device is provided, including the following operations: generating first to fourth control signals according to a read enable signal and a logic value of a data being written into a memory cell; in a write operation of the data having a first logic value, charging a first data line to have a voltage level of a first voltage by turning on a first write assist switch in response to the first control signal, and discharging a second data line to have a voltage level of a second voltage by turning on a second write assist switch in response to the second control signal; and in the write operation of the data having a second logic value different from the first logic value, discharging the first data line to have the voltage level of the second voltage by turning on a third write assist switch in response to the third control signal, and charging the second data line to have the voltage level of the first voltage by turning on a fourth write assist switch in response to the fourth control signal. The memory cell is coupled between a first node on the first data line, between a write driver circuit and the first and third write assist switches, and a second node on the second data line, between the write driver circuit and the second and fourth write assist switches.

In some embodiments, the control method further includes operations of generating an inverted read enable signal and generating an inverted data. The generating the first to fourth control signals includes generating, by a first NAND gate, the first control signal according to the inverted read enable signal and the data; and generating, by a first transmission gate, the third control signal according to the read enable signal, the inverted read enable signal, and the inverted data.

In some embodiments, the generating the first to fourth control signals further includes: generating, by a second transmission gate, the second control signal according to the read enable signal, the inverted read enable signal, and the data; and generating, by a second NAND gate, the fourth control signal according to the inverted read enable signal and the inverted data.

In some embodiments, the control method further includes operations of turning off the third and fourth write assist switches when the first and second write assist switches are turned on.

In some embodiments, the control method further includes operations of in a read operation of the data stored in the memory cell, turning off the first to fourth write assist switches.

In some embodiments, the control method further includes operations of generating an inverted read enable signal according to the read enable signal; and transmitting the data from the write driver circuit to the first data line by turning on a first write switch in response to the inverted read enable signal. The first write switch is coupled between the write driver circuit and the first node.

In some embodiments, the control method further includes operations of transmitting an inverted data from the write driver circuit to the second data line by turning on a second write switch in response to the inverted read enable signal, wherein the second write switch is coupled between the write driver circuit and the second node.

In some embodiments, a device is provided, including multiple memory cells arranged in multiple memory columns; and multiple pairs of first and second write assist circuits each pair arranged in one of the memory columns. In each pair of the first and second write assist circuits, the first write assist circuit includes a first P-type transistor and a first N-type transistor that are coupled to a first data line, and the second write assist circuit includes a second P-type transistor and a second N-type transistor that are coupled to a second data line, wherein the first and second data lines are a pair of complementary data lines coupled to one of the memory cells in a corresponding one of the memory columns. In a write operation to a cell in the memory cells, a selected one of the first and second P-type transistors coupled thereto is configured to be turned on to transmit a first supply voltage to the cell, and a selected one of the first and second N-type transistor coupled thereto is configured to be turned on to transmit a second supply voltage, different from the first supply voltage, to the cell.

In some embodiments, the device further includes a write driver circuit configured to transmit a data to the cell through the first data line coupled thereto in the write operation. The write driver circuit is arranged on a first end of the memory columns, and the pairs of first and second write assist circuits are arranged on a second end, opposite to the first end, of the memory columns.

In some embodiments, each of the first and second P-type transistors has a first terminal coupled to a first voltage terminal providing the first supply voltage and a second terminal coupled to a corresponding one of the first and second data lines, and each of the first and second N-type transistors has a first terminal coupled to a second voltage terminal providing the second supply voltage and a second terminal coupled to a corresponding one of the first and second data lines.

In some embodiments, the device further includes a control circuit configured to generate, according to a read enable signal and a logic value of a data configured to be written to the cell, first to fourth control signals for switching the first and second P-type transistors and the first and second N-type transistors. When the data has a high logic value, the read enable signal is configured to have a low logic value, the first control signal for the first P-type transistor has the low logic value, and the second control signal for the second N-type transistor has the high logic value.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a memory cell configured to operate with a first supply voltage and a second supply voltage different from the first supply voltage; and
   a first write assist circuit comprising a first write assist switch and a second write assist switch that are coupled to the memory cell through a first data line, wherein in a write operation of a data, having a first logic value, to the memory cell,
   the first write assist switch is configured to transmit the first supply voltage to the first data line in response to a first control signal, received at a control terminal of the first write assist switch and having a voltage level of the second supply voltage, when the second write assist switch is configured to be turned off in response to a second control signal,
   wherein in a read operation of the data the second control signal is floating.

2. The device of claim 1, wherein the first write assist switch comprises a first transistor of a first conductivity type and the second write assist switch comprises a second transistor of a second conductivity type different from the first conductivity type.

3. The device of claim 1, wherein the first write assist switch has a first terminal coupled to the first data line and a second terminal coupled to a first voltage terminal providing the first supply voltage, and
the second write assist switch has a first terminal coupled to the first data line and a second terminal coupled to a second voltage terminal providing the second supply voltage.

4. The device of claim 1, wherein in the write operation of the data, having a second logic value different from the first logic value, to the memory cell,
the second write assist switch is configured to be turned on to transmit the second supply voltage to the first data line in response to the second control signal, received at a control terminal of the second write assist switch and having the voltage level of the first supply voltage, when the first write assist switch is configured to be turned off.

5. The device of claim 4, further comprising:
a control circuit configured to generate the first and second control signals according to a read enable signal and a logic value of the data,
wherein in the read operation of the memory cell, the read enable signal is configured to have a high logic value, and the first control signal has the high logic value for turning off the first write assist switch.

6. The device of claim 1, further comprising:
a second write assist circuit comprising a third write assist switch and a fourth write assist switch that are coupled to the memory cell through a second data line which is a complementary data line for the first data line, wherein in the write operation of the data, having the first logic value, to the memory cell,
the third write assist switch is configured to transmit the second supply voltage to the second data line in response to a third control signal, having a voltage level of the first supply voltage, when the fourth write assist switch is configured to be turned off.

7. The device of claim 6, further comprising:
a control circuit configured to generate the first control signal and the third control signal according to a read enable signal and a logic value of the data, wherein in the write operation of the data having the first logic value to the memory cell, the read enable signal is configured to have a second logic value different from the first logic value, the first control signal has the second logic value, and the third control signal has the first logic value.

8. The device of claim 7, wherein in the write operation of the data, having the second logic value, to the memory cell,
the fourth write assist switch is configured to transmit the first supply voltage to the second data line in response to a fourth control signal, having the second logic value when the third write assist switch is configured to be turned off.

9. The device of claim 1, further comprising:
a write driver circuit configured to transmit the data to the memory cell through the first data line, wherein the memory cell is coupled between the write driver circuit and the first write assist circuit.

10. A method, comprising:
generating first to fourth control signals according to a read enable signal and a logic value of a data being written into a memory cell;
in a write operation of the data having a first logic value, charging a first data line to have a voltage level of a first voltage by turning on a first write assist switch in response to the first control signal, and discharging a second data line to have a voltage level of a second voltage by turning on a second write assist switch in response to the second control signal;
in the write operation of the data having a second logic value different from the first logic value, discharging the first data line to have the voltage level of the second voltage by turning on a third write assist switch in response to the third control signal, and charging the second data line to have the voltage level of the first voltage by turning on a fourth write assist switch in response to the fourth control signal,
wherein the memory cell is coupled between a first node on the first data line, between a write driver circuit and the first and third write assist switches, and a second node on the second data line, between the write driver circuit and the second and fourth write assist switches; and
in a read operation of the memory cell, turning off the first write assist switch in response to the first control signal and the fourth write assist switch in response to the fourth control signal, wherein both the first control signal and the fourth control signal have the first logic value.

11. The method of claim 10, further comprising:
generating an inverted read enable signal and generating an inverted data;
wherein the generating the first to fourth control signals comprises:
generating, by a first NAND gate, the first control signal according to the inverted read enable signal and the data; and
generating, by a first transmission gate, the third control signal according to the read enable signal, the inverted read enable signal, and the inverted data.

12. The method of claim 11, wherein the generating the first to fourth control signals further comprises:
generating, by a second transmission gate, the second control signal according to the read enable signal, the inverted read enable signal, and the data; and
generating, by a second NAND gate, the fourth control signal according to the inverted read enable signal and the inverted data.

13. The method of claim 10, further comprising:
turning off the third and fourth write assist switches when the first and second write assist switches are turned on.

14. The method of claim 10, further comprising:
in the read operation of the data stored in the memory cell, turning off the second write assist switch and the third write assist switche.

15. The method of claim 10, further comprising:
generating an inverted read enable signal according to the read enable signal; and
transmitting the data from the write driver circuit to the first data line by turning on a first write switch in response to the inverted read enable signal, wherein the first write switch is coupled between the write driver circuit and the first node.

16. The method of claim 15, further comprising:
transmitting an inverted data from the write driver circuit to the second data line by turning on a second write switch in response to the inverted read enable signal, wherein the second write switch is coupled between the write driver circuit and the second node.

17. A device, comprising:
a plurality of memory cells arranged in a plurality of memory columns; and
a plurality of pairs of first and second write assist circuits each pair arranged in one of the plurality of memory columns,
wherein in each pair of the first and second write assist circuits, the first write assist circuit comprises a first P-type transistor and a first N-type transistor that are coupled to a first data line, and
the second write assist circuit comprises a second P-type transistor and a second N-type transistor that are coupled to a second data line, wherein the first and second data lines are a pair of complementary data lines coupled to one of the plurality of memory cells in a corresponding one of the plurality of memory columns,
wherein in a write operation to a cell in the plurality of memory cells, a selected one of the first and second P-type transistors coupled thereto is configured to be turned on to transmit a first supply voltage to the cell, and
a selected one of the first and second N-type transistor coupled thereto is configured to be turned on to transmit a second supply voltage, different from the first supply voltage, to the cell,
wherein in a read operation to the cell, the first P-type transistor is turned off in response to a first control signal and the first N-type transistor is turned off in response to a second control signal different from the first control signal.

18. The device of claim 17, further comprising:
a write driver circuit configured to transmit a data to the cell through the first data line coupled thereto in the write operation,
wherein the write driver circuit is arranged on a first end of the plurality of memory columns, and the plurality of pairs of first and second write assist circuits are arranged on a second end, opposite to the first end, of the plurality of memory columns.

19. The device of claim 17, wherein each of the first and second P-type transistors has a first terminal coupled to a first voltage terminal providing the first supply voltage and a second terminal coupled to a corresponding one of the first and second data lines, and
each of the first and second N-type transistors has a first terminal coupled to a second voltage terminal providing the second supply voltage and a second terminal coupled to a corresponding one of the first and second data lines.

20. The device of claim 17, further comprising:
a control circuit configured to generate, according to a read enable signal and a logic value of a data configured to be written to the cell, the first control signal, the second control signal, a third control signal for the second P-type transistor and a fourth control signal for the second N-type transistor,
wherein when the data has a high logic value, the read enable signal is configured to have a low logic value, the first control signal for the first P-type transistor has the low logic value, and the fourth control signal for the second N-type transistor has the high logic value.

* * * * *